United States Patent [19]

Cherry

[11] Patent Number: 4,529,848
[45] Date of Patent: Jul. 16, 1985

[54] SWITCH WITH CONICAL SPRING ACTUATOR

[75] Inventor: Walter L. Cherry, Winnetka, Ill.

[73] Assignee: Cherry Electrical Products Corporation, Waukegan, Ill.

[21] Appl. No.: 525,560

[22] Filed: Aug. 22, 1983

Related U.S. Application Data

[63] Continuation-in-part of Ser. No. 318,483, Nov. 5, 1981, abandoned.

[51] Int. Cl.³ ................... H01H 13/70; H01G 5/01
[52] U.S. Cl. ..................... 200/5 A; 200/DIG. 1; 200/159 B; 200/340; 361/288
[58] Field of Search ............... 361/283, 287–298; 200/DIG. 1, 5 A, 5 R, 159 B, 276, 340; 340/365 C

[56] References Cited

U.S. PATENT DOCUMENTS

| | | | |
|---|---|---|---|
| 3,707,609 | 12/1972 | Dapot et al. | 200/5 A X |
| 3,806,673 | 4/1974 | Boulanger | 200/5 A |
| 3,842,230 | 10/1974 | Kushio | 200/5 A X |
| 4,417,115 | 11/1983 | Desmarais et al. | 200/5 A X |
| 4,458,293 | 7/1984 | Cherry | 361/288 |
| 4,466,046 | 8/1984 | Cherry | 361/288 |

FOREIGN PATENT DOCUMENTS 57-55014 4/1982 Japan.
654950 3/1979 U.S.S.R..

OTHER PUBLICATIONS

IBM Technical Disclosure Bulletin, vol. 24, No. 8, (Jan., 1982).

Primary Examiner—J. R. Scott
Attorney, Agent, or Firm—Willian Brinks Olds Hofer Gilson & Lione Ltd.

[57] ABSTRACT

A capacitive or a membrane switch is provided with a coil spring which has a conical base and a top cylindrical portion. The spring biases a switch key to its rest position. When the key is pressed, the conical base is compressed to provide an exponentially increasing counter-force and to actuate the switch at a predetermined actuation point. After the switch is actuated, the key continues to move and compresses the cylindrical portion of the spring to provide a linearly increasing counter-force which indicates overtravel operation of the switch.

30 Claims, 5 Drawing Figures

SWITCH WITH CONICAL SPRING ACTUATOR

CROSS REFERENCE TO RELATED APPLICATION

This application is a continuation-in-part of Ser. No. 318,483, filed Nov. 5, 1981, now abandoned.

TECHNICAL FIELD

The invention relates to keyboard switches with capacitive or contact switching elements. More particularly, the invention relates to keyboard switches with springs which bias pushbutton keys upwardly and which provide a desirable overtravel operation for the keys.

BACKGROUND OF THE INVENTION

Capacitive keyboards utilize a variation in capacitance between at least two capacitor plates to indicate actuation of a key. In operation, one of the capacitive plates is mounted for reciprocating movement with respect to an underlying stationary plate to provide an increased capacitance when a key is pressed. It has been suggested that the movable capacitive plate may be shaped in the form of a conical spring which biases the key upwardly and which is compressed to provide an increased capacitance when the key is pressed.

Membrane switch keys are constructed with a stationary contact and a movable overlying contactor which is mounted on a resilient membrane. In operation, when a key is pressed, the membrane flexes downwardly until the contactor is pressed against the stationary contact. When the key is released, the flexible membrane lifts the contactor away from the its contact. Springs have been used to bias such keys upwardly to a rest position.

In the human engineering of pushbutton switches, it has been found desirable to allow a pushbutton key to move slightly past the point at which it is actuated. This "overtravel" operation allows an operator to naturally stroke the key with enough pressure to reliably actuate a switch. Also, it is advisable to change the tactile feel of the key after switch actuation, so that an operator is signaled when overtravel begins. It is also desirable to sharply define the end of overtravel movement to indicate that the key should be released.

Accordingly, it is an object of the invention to provide a membrane switch or a capacitive switch with an overtravel operation.

It is another object of the invention to provide such capacitive or membrane switch keys with a spring actuator which biases the keys upwardly and provides the desirable overtravel operation.

Another object of the invention is to provide such switch keys with a spring actuator which has a conical bottom portion that provides a desirable exponentially increasing counter-force to the pressing of a key and a straight cylindrical top portion which provides a linearly increasing counter-force to signal overtravel of the key.

A further object of the invention is to provide a membrane or capacitive switch key with a stop pin which sharply indicates the end of the overtravel movement of the key.

SUMMARY OF THE INVENTION

In order to achieve the objects of the invention and to overcome the problems of the prior art, one embodiment of the switch key of the invention includes a stationary contact and an adjacent movable contactor which is deflected into conductive connection with the stationary contact when a pushbutton key is pressed. The contact is supported on a substrate and the movable contactor is mounted on a resilient membrane which is supported by a spacer over the stationary contact. The spacer has an aperture through which the contactor flexes to press against its underlying contact.

An operating spring provides an upward biasing force for the key. The spring has a conical base which provides an exponentially increasing counter-force when the key is pressed to actuate the underlying switch contacts. The spring has a cylindrical top portion which provides a linearly increasing counter-force as the key is pressed past its switch actuation point and through an overtravel interval. A stop member blocks downward movement of the key at the end of its overtravel interval.

In one embodiment the base coil of the spring is supported in spaced relation to the underlying resilient membrane by slots formed in a switch housing. In another embodiment the base coil is supported by the spacer in concentric relation to the spacer aperture.

Another embodiment of the switch key of the invention includes a conducting stationary base plate. The base plate is covered by a dielectric film and a conducting operating spring is supported on the dielectric film over the plate. The operating spring has a conical base which provides an exponentially increasing counter-force to a switch key when the key is pressed to compress the spring. When the spring is compressed to a predetermined position, it defines an actuation capacitance and, when it is released, it expands to define a rest capacitance less than the actuation capacitance.

The spring has a top cylindrical portion which compresses as the key is pressed past its point of actuation. The compressing cylindrical portion of the spring provides a linearly increasing counter-force against the downward movement of the key and thus provides an overtravel tactile sensation for the key. The key includes a stop member which blocks further downward movement after the key has moved downwardly through a predetermined overtravel interval.

DETAILED DESCRIPTION OF PREFERRED EMBODIMENTS

Figure 1:
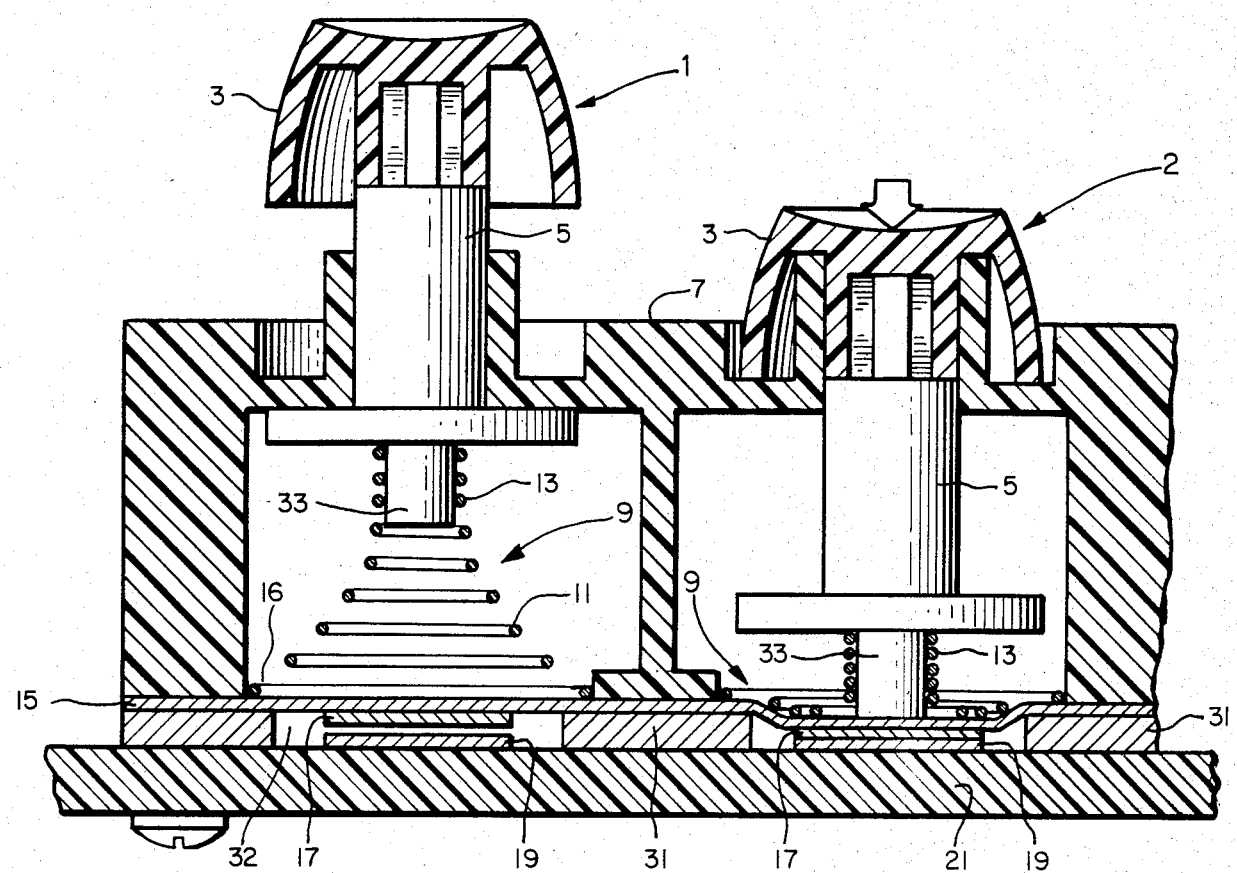
FIG. 1 illustrates a cross-sectional view of a keyboard with membrane switches having the conical operating spring of the invention.

The remaining portion of the specification will describe preferred embodiments of the invention when read in conjunction with the attached drawings, in which like reference characters designate identical apparatus.

FIG. 1 illustrates a cross-sectional view of a portion of a membrane switch keyboard. As shown in FIG. 1, the keyboard includes a switch key 1 shown in its rest position and an adjacent switch key 2 which has been pressed down to its actuation position.

The switch keys 1 and 2 have cap portions 3 which are affixed to plungers 5 that are slidably mounted in a housing 7 for reciprocating movement in the housing. Each of the keys has a resilient operating spring 9 which may be made of, for example, copper or stainless steel. The operating spring 9 has coils which are shaped to provide a conical base portion 11 and a cylindrical top portion 13.

Each of the springs is supported on a relatively thin, resilient insulating membrane 15 which may be made of a suitable flexible dielectric material such as polycarbonate or a polyester such as poly (ethylene teraphthalate). The resilient membrane 15 supports top conducting metal plates 17 which may be formed on the membrane by conventional photolithographic techniques. An insulating substrate supports bottom conducting plates 19 opposite the plates 17. An insulating spacer 31 with apertures 32 supports the membrane 15. The apertures 32 are aligned so that each top plate 17 is suspended over a corresponding bottom plate 19.

Figure 2:
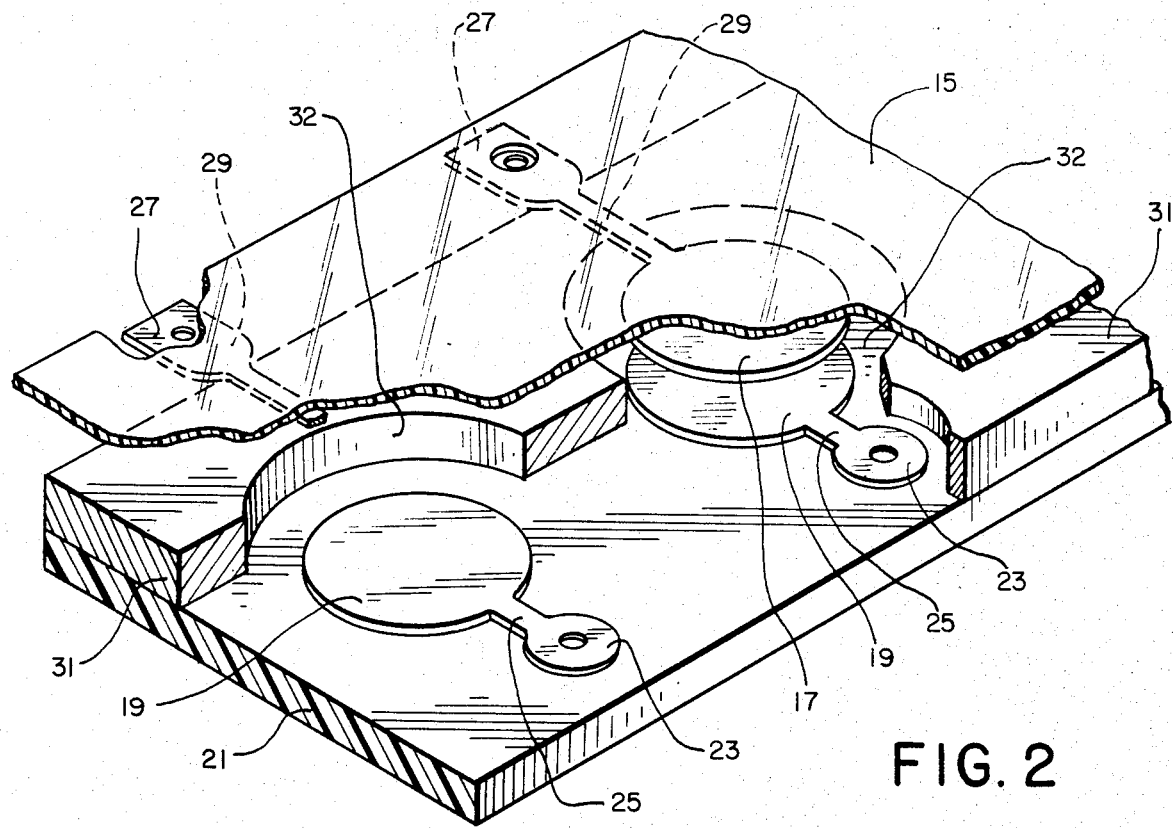
FIG. 2 illustrates an exploded view of membrane contacts for the switches of FIG. 1.

FIG. 2 illustrates an exploded cut-away perspective view of a portion of the substrate 21, conducting plates 17 and 19, spacer 31 and resilient insulating membrane 15. As shown in FIG. 2, the bottom conducting plates 19 each include a conducting eyelet 23 which is conductively connected to the plate by an intermediate conductive trace 25. The top plates 17 have corresponding conducting eyelets 27 and associated interconnecting conductive traces 29. As indicated above, the flexible insulating membrane 15 is supported in spaced relation to the underlying substrate 21 by the insulating spacer 31. The spacer has apertures 32 which are aligned with the top and bottom plates 17 and 19.

As shown in FIG. 1, each of the plungers 5 has an extention 33 which engages and holds the top cylindrical portion 13 of the spring and thus aligns the top portion of the spring with its key 1,2. A base coil 16 of the spring rests on the flexible insulating membrane 15 and is supported by the spacer 31. Coils of the spring above the base coil are dimensioned to enter the aperture 32 when the key is pressed. The base coil 16 of the spring is supported by the spacer 31 so that there is no downward force on the membrane 15 over the aperture 32 when the switch key is at rest. Force on the membrane in the rest position of the switch key is undesirable, because it could result in permanent displacement of the material of the membrane into the aperture.

As shown in FIG. 1, the operating spring 9 of the switch key 1 biases the key upwardly so that the underlying contacts 17 and 19 are spaced from one another in an open circuit position.

When the key is pressed, for example as shown with respect to the switch key 2, the plunger 5 moves downwardly against an exponentially increasing counter-force which is provided by the conical portion 11 of the spring as the spring is compressed. The exponentially increasing counter-force provides a desirable positive tactile sensation for a switch key operator and indicates to the operator that the key is being pressed to its switch actuation position. As the key is pressed down, the spring 9 flexes the resilient insulating membrane 15 until the top conducting plate 17 contacts its opposite bottom conducting plate 19. The conductive contact of the adjacent plates indicates that the switch key has been actuated.

After the plates 17 and 19 are in contact, the switch key of FIG. 1 continues to move downwardly in response to actuating pressure. This overtravel movement of the key after the switch contacts are closed is desirable from a human engineering standpoint, because it allows an operator to comfortably and rapidly operate switch keys with a minimum of switch actuation errors.

During overtravel movement of the plunger 5, the top portion 13 of the spring provides a linearly increasing counter-force as it compresses. The linearly increasing counter-force gives the operator a distinctive tactile sensation which indicates overtravel movement of the key. Thus, in operation, the operator initially feels a counter-force which exponentially increases to a switch actuation point at which the plates 17 and 19 contact one another. Thereafter the counterforce increases linearly to provide a distinctive overtravel feel. The shape of the operating spring 9 thus provides desirable tactile feedback in operation of the switch of FIGS. 1 and 2.

The extension 33 of each plunger 5 may be dimensioned to abut the membrane 15 and underlying plates 17 and 19 at the end of an overtravel interval to prevent further downward movement of the plunger 5 and thus indicate to the operator that the actuating pressure should be released. The extension 33 may thus enable the operator to avoid applying excessive actuating pressure, thereby insuring a relatively longer life for the components of the key. Downward movement of the switch key may also be arrested by abutment of the key cap 3 against the housing 7 or by compression and resultant stiffening of the cylindrical coils of the spring.

Figure 3:
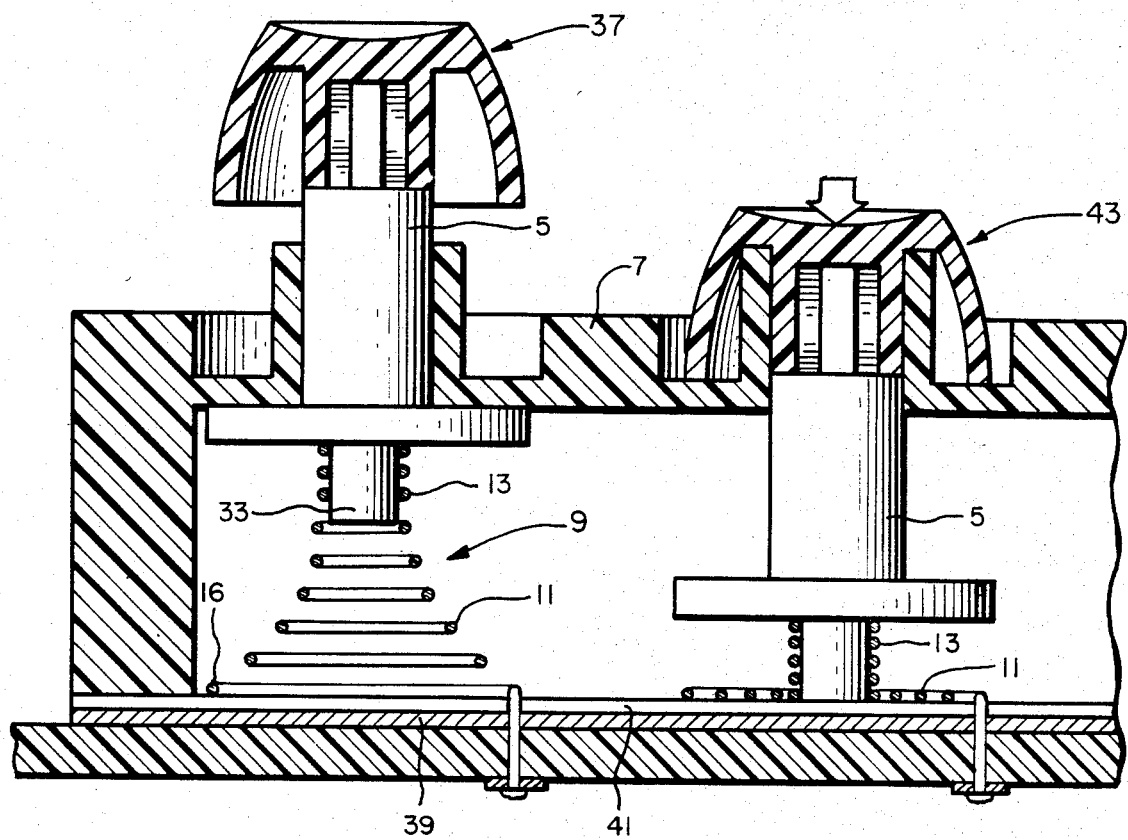
FIG. 3 illustrates a cross-sectional view of a keyboard with capacitive switches having the conical operating spring of the invention.

FIG. 3 illustrates a cross-sectional view of a portion of a capacitive keyboard in accordance with the invention. In operation, a switch key 37 is biased upwardly by the conductive operating spring 9 in the manner described with respect to FIG. 1. The spring 9 overlies a stationary capacitive plate 39 which is covered by a dielectric film 41. The spring 9 and its associated capacitive plate 39 thus form a capacitor.

In operation, when the spring 9 is compressed, the coils of its conical portion 11 are pressed adjacent to the underlying stationary plate 39 to provide an increasing capacitance. Switch actuation is indicated when the spring 9 has compressed sufficiently to provide a characteristic switch actuation capacitance.

The conical portion 11 of the spring 9 of FIG. 3 provides an exponentially increasing counter-force as well as an increasing capacitance when the plunger 5 is pressed down. After the actuation capacitance is generated, the plunger 5 continues to move down in response to downward pressure and the top portion 13 of the spring provides a linearly increasing overtravel counter-force. The overtravel counter-force has the desirable operational characteristics previously described with respect to FIG. 1.

When downward pressure on the key is released, the spring 9 resiliently biases the key upwardly to the position indicated for the key 37 of FIG. 3. In the rest position the switch capacitance is reduced to a nominal value.

Two adjacent switch keys have been illustrated in FIGS. 1-3 to facilitate an understanding of the features of the invention. However, it should be understood that the invention is not limited to any particular number of switch keys. Thus, the term keyboard has been used to describe an apparatus which employs one or more switch keys having the desirable features of the invention.

Figure 4:
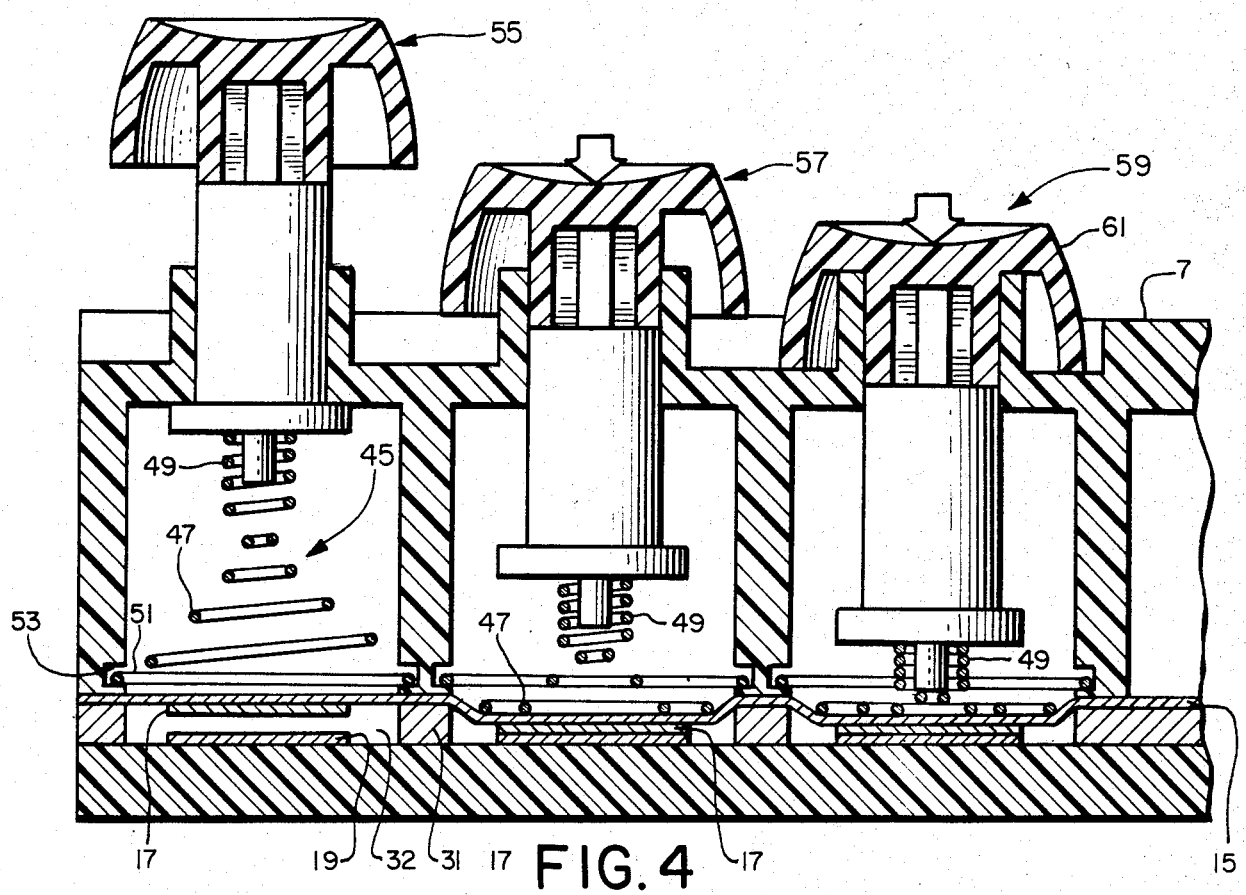
FIG. 4 illustrates a cross-sectional view of a keyboard with membrane switches and conical operating springs supported in slots of a housing.

FIG. 4 illustrates a membrane switch keyboard with a preferred shape of a conical operating spring. As shown in FIG. 4, an hourglass-shaped conical spring 45 has a bottom conical portion 47 and a top cylindrical portion 49. A base coil 51 of the spring is supported in a slot 53 of the housing 7 in spaced relation to the underlying resilient membrane 15. The base coil is supported in spaced relation in order to avoid pressing the surface of the membrane 15 into the aperture 32 of the insulating spacer 31 when the switch key is at the rest position illustrated for a key 55. As explained previously, pressure on the membrane during the rest state of the switch could cause the membrane to permanently settle into the aperture 32 and thus prevent proper operation of the switch.

As shown in FIG. 4, a switch key 57 is pressed to an actuating position at which the conducting plates 17 and 19 are in contact. In the actuating position the top cylindrical coils 49 are not completely compressed together and the base coils 47 have moved into the aperture 32 to flex the membrane downwardly and thus press the plates together.

A key 59 is shown at the end of overtravel movement for the switch. After the actuation point illustrated for the key 57, the key continues to move downwardly until the top cylindrical coils 49 are compressed together. The end of the key stroke of the switch keys of FIG. 4 is sharply defined by abutment of a key cap portion 61 of the key 59 against the top surface of the housing 7.

Figure 5:
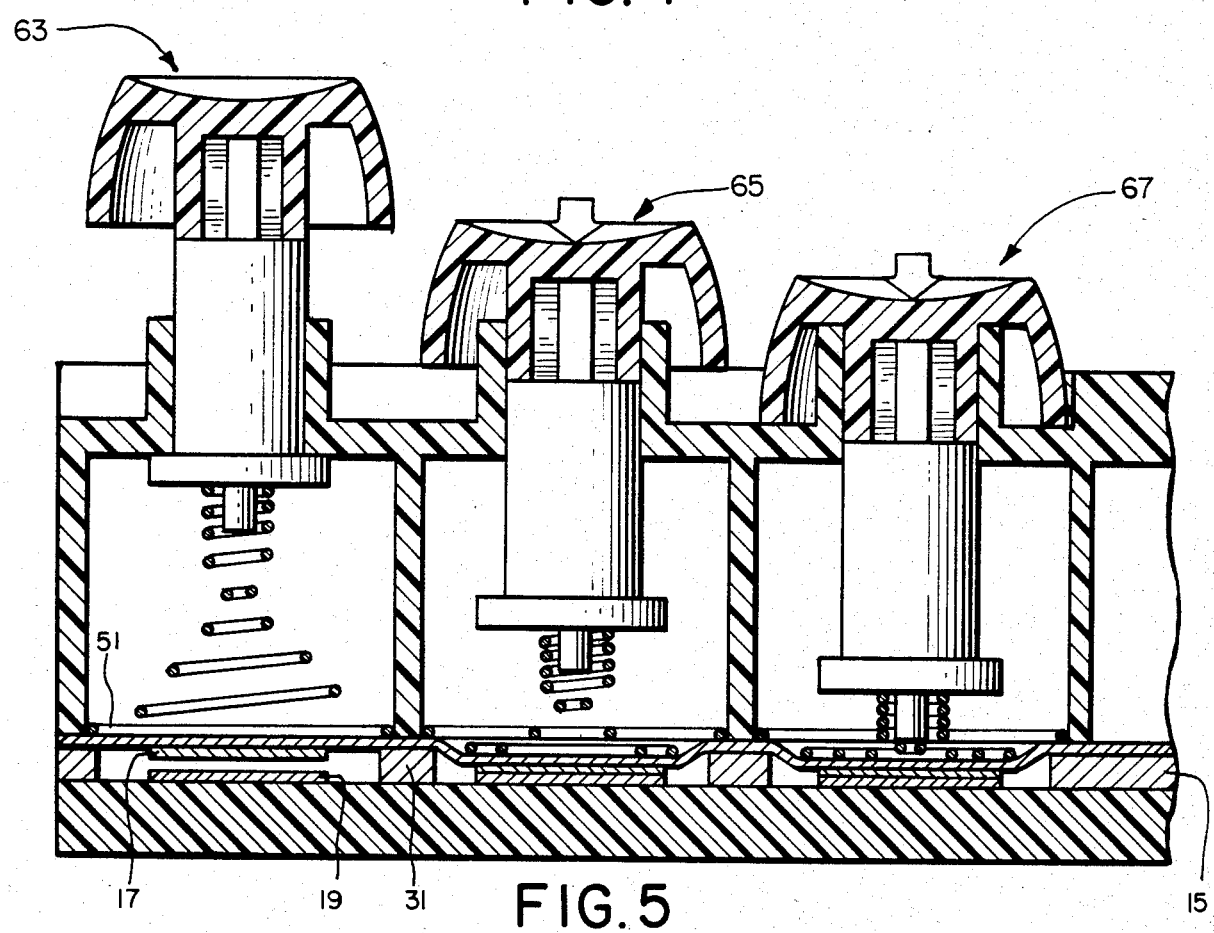
FIG. 5 illustrates a cross-sectional view of a keyboard with membrane switches and conical operating springs supported on a membrane.

FIG. 5 illustrates the rest position, switch actuation position and end-of-overtravel position respectively for keys 63, 65 and 67. In the keys of FIG. 5, the base coil 51 rests on the top surface of the membrane 15. However, the base coil does not bias the membrane into the aperture 32, because it is supported by the underlying insulating spacer 31. The coils of the conical portion 47 of the spring above the base coil 51 are dimensioned to move into the aperture 32 and to thus actuate the switch, as shown for the key 57. As explained above, after the switch actuation point, the key continues to move downward over an overtravel interval to the end position shown for the key 67.

The invention may be embodied in forms other than those illustrated in the drawings, without departing from its spirit or essential characteristics. The present embodiments are, therefore, to be considered in all respects as illustrative and not restrictive. The scope of the invention is therefore indicated by the claims rather than by the foregoing description. Accordingly, all changes which come within the meaning and range of the equivalents of the claims are intended to be embraced therein.

I claim:

1. A keyboard switch, comprising:
   at least one electrically conducting contact means;
   at least one electrically conducting contactor means;
   a resilient sheet for supporting said at least one contactor means;
   spacer means for supporting said contactor means in spaced relation to said contact means, said spacer means including at least one aperture aligned with said contactor means and contact means;
   plunger means responsive to the application and release of an actuation force for reciprocating to flex and release said resilient sheet, so that said contactor means and contact means are selectively conductively connected and disconnected;
   spring means for biasing said plunger means to a rest position at which said resilient sheet is not flexed, the spring means including a top portion engaging said plunger means and a conically shaped bottom portion; and
   means for supporting the bottom portion of said spring means so that the spring means does not flex the resilient sheet when the plunger means is at its rest position;
   said bottom portion of the spring means compressing when said plunger means is pressed to provide an actuation tactile sensation and to flex said contactor against said contact, said top portion of the spring means thereafter compressing in response to further movement of the plunger means to provide a distinguishable overtravel tactile sensation.

2. The keyboard switch of claim 1, wherein said means for supporting includes a portion of said spacer means for supporting the bottom portion of the spring means in concentric relation to said aperture.

3. The keyboard switch of claim 1, wherein said means for supporting includes means for supporting the bottom portion of said spring means in spaced relation to said resilient sheet.

4. The keyboard switch of claim 3, wherein said spring means is a coil spring having a base coil and said means for supporting includes a housing with slots formed therein for engaging said base coil to support the spring above the resilient sheet.

5. The keyboard switch of claim 1, wherein said resilient sheet is made of an insulating plastic.

6. The keyboard switch of claim 1, wherein said top portion is cylindrically shaped to provide a linear counter-force to said plunger means during overtravel movement of the plunger means.

7. The keyboard switch of claim 6, wherein the conically shaped bottom portion of the spring means and the cylindrically shaped top portion are joined by an intermediate neck portion having a diameter reduced with respect to the smallest diameter dimension of the bottom portion or the top portion.

8. The keyboard switch of claim 1, including stop means for blocking movement of said plunger means to define an end point for the overtravel movement of the plunger means.

9. The keyboard switch of claim 8, wherein said stop means includes a peg formed on said plunger means, said top portion of the spring means concentrically engaging said peg to maintain the position of the spring means with respect to the plunger means.

10. A keyboard switch, comprising:
    at least one electrically conducting contact means;
    at least one electrically conducting contactor means;
    a resilient insulating sheet supporting said at least one contactor means opposite and in facing relation to said contact means;
    spacer means for separating said contactor means and contact means, the spacer means including at least one aperture disposed for allowing the contactor means to flex into and out of conductive contact with the contact means;
    plunger means disposed over said contactor means and contact means for moving downwardly from a rest position when pressed and upwardly to the rest position when released; and a coil spring for biasing the plunger means upwardly to its rest position, said coil spring having a conically shaped bottom portion for compressing to provide a predetermined actuation counter-force and to flex said contactor against said contact when said plunger means is moved downwardly from its rest position to a predetermined switch actuation position, the spring having a top cylindrically shaped portion for compressing to provide a distinguishable overtravel counter-force when the plunger means moves downwardly from said switch actuation position to a predetermined stop position.

11. The keyboard switch of claim 10, further including means for supporting said spring in spaced relation above said resilient sheet, the conically shaped bottom portion of the spring having coils dimensioned for compressing in telescoping relation to flex the sheet and said contactor downwardly.

12. The keyboard switch of claim 10, wherein said spring has a base coil and the keyboard switch further includes a housing with slots formed therein for engaging the base coil to support the spring above the resilient sheet.

13. The keyboard switch of claim 10, wherein said spacer means includes means for supporting the bottom portion of the spring in concentric relation to said aperture.

14. The keyboard switch of claim 10, further including a peg formed on said plunger means for defining said stop position.

15. The keyboard switch of claim 10, wherein said bottom portion provides an exponentially increasing counter-force and the top portion provides a linearly increasing counter-force when the spring is compressed.

16. A keyboard switch, comprising:
plunger means for moving downwardly from a rest position to a switch actuation position and thereafter to a stop position when pressed and upwardly to the rest position when released;
switching means for defining a switch actuation state when said plunger means moves to the switch actuation position and a switch release state when the plunger means moves to its rest position; and
a coil spring for biasing the plunger means upwardly to its rest position and for operating said switching means in response to movement of the plunger means;
said coil spring having a plurality of coils forming a conically shaped actuating portion for compressing to provide a predetermined actuation counter-force and to operate said switching means to define said switch actuation state when the plunger means moves to its switch actuation position;
said coil spring having a plurality of coils forming an overtravel portion for compressing to provide an overtravel counter-force when the conically shaped portion is compressed and said plunger means moves downwardly from said switch actuation position to the stop position.

17. The keyboard switch of claim 16, wherein said overtravel portion of the spring is cylindrically shaped to provide a linearly increasing overtravel counterforce as it compresses.

18. The keyboard switch of claim 16, including means for supporting said conically shaped actuating portion of the spring in spaced relation to said switching means.

19. The keyboard switch of claim 16, wherein said switching means includes means for defining a capacitance corresponding to the degree of compression of said conically shaped actuating portion of the spring.

20. The keyboard switch of claim 16, wherein said switching means includes two conducting switch contacts, means for conductively connecting the contacts when the conically shaped portion of the spring is compressed at said switch actuation position, and means for disconnecting the contacts when the conically shaped portion of the spring expands to hold the plunger means at its rest position.

21. A keyboard switch, comprising:
electrically conducting contact means;
electrically conducting contactor means;
a resilient sheet supporting said contactor means opposite and in facing relation to said contact means;
spacer means for separating said contactor means and contact means, the spacer means including an aperture disposed for allowing the contactor means to flex into and out of conductive contact with the contact means;
plunger means for moving downwardly from a rest position to a switch actuation position and thereafter to a stop position when pressed and upwardly to the rest position when released; and
a coil spring for biasing the plunger means upwardly to its rest position and for flexing said resilient sheet to selectively move said contactor means into and out of conductive contact with said contact means in response to movement of the plunger means;
said coil spring having a conically shaped bottom portion for compressing to provide a predetermined actuation counter-force and to flex said contactor means against said contact means when the plunger means moves to said switch actuation position;
said spring having a cylindrically shaped top portion for engaging said plunger means and compressing to provide an overtravel counter-force different from said actuation counter-force when the plunger means moves downwardly from said switch actuation position to the stop position;
said spacer means including means for supporting the bottom portion of the spring in concentric relation to said aperture.

22. A keyboard switch, comprising:
electrically conducting contact means;
electrically conducting contactor means;
a resilient sheet supporting said contactor means opposite and in facing relation to said contact means;
spacer means for separating said contactor means and contact means, the spacer means including an aperture disposed for allowing the contactor means to flex into and out of conductive contact with the contact means;
plunger means for moving downwardly from a rest position to a switch actuation position and thereafter to a stop position when pressed and upwardly to the rest position when released; and
a coil spring for biasing the plunger means upwardly to its rest position and for flexing said resilient sheet to selectively move said contactor means into and out of conductive contact with said contact means in response to movement of the plunger means; and means for supporting the bottom portion of said spring in spaced relation to said resilient sheet;

said coil spring having a conically shaped bottom portion for compressing to provide a predetermined actuation counter-force and to flex said contactor means against said contact means when the plunger means moves to said switch actuation position;

said spring having a cylindrically shaped top portion for engaging said plunger means and compressing to provide an overtravel counter-force different from said actuation counter-force when the plunger means moves downwardly from said switch actuation position to the stop position.

23. The keyboard switch of claim 22, wherein said bottom portion of the spring includes at least one base coil and said means for supporting includes a housing with slots for supporting the base coil.

24. A keyboard switch, comprising:

plunger means for moving downwardly from a rest position to a switch actuating position and thereafter to a stop position when pressed and upwardly to the rest position when released;

a conducting coil spring for biasing the plunger means upwardly to its rest position;

a stationary conducting plate;

a dielectric film covering said stationary plate; and means for supporting said conducting coil spring over the dielectric film and said stationary conducting plate;

said conducting coil spring having a conically shaped bottom portion for compressing to provide a predetermined actuation capacitance with respect to said stationary plate and to provide a predetermined actuation counter-force when said plunger means is pushed downwardly to said switch actuating position, the bottom portion expanding when the plunger means is released to define a predetermined rest capacitance less than the actuation capacitance;

said spring having a cylindrically shaped top portion for compressing to provide an overtravel counter-force when the plunger means moves downwardly from said switch actuation position to the stop position.

25. The keyboard switch of claim 24, including a peg formed on said plunger means for defining said stop position.

26. A keyboard switch, comprising:

at least one electrically conducting contact means;

at least one electrically conducting contactor means;

a resilient sheet for supporting said at least one contactor means;

spacer means for supporting said contactor means in spaced relation to said contact means, said spacer means including at least one aperture aligned with said contactor means and contact means;

plunger means responsive to the application and release of an actuation force for reciprocating to flex and release said resilient sheet, so that said contactor means and contact means are selectively conductively connected and disconnected;

spring means for biasing said plunger means to a rest position at which said resilient sheet is not flexed, the spring means including a top portion for engaging said plunger means and a bottom portion for flexing said resilient sheet in response to the application of said actuation force to said plunger means; and means for supporting the bottom portion of said spring means so that the spring means does not flex the resilient sheet when the plunger means is at its rest position.

27. The keyboard switch of claim 26, wherein said means for supporting includes a portion of said spacer means for supporting the bottom portion of the spring means in concentric relation to said aperture.

28. The keyboard switch of claim 26, wherein said means for supporting includes means for supporting the bottom portion of said spring means in spaced relation to said resilient sheet.

29. The keyboard switch of claim 28, wherein said spring means is a coil spring having a base coil and said means for supporting includes a housing with slots formed therein for engaging said base coil to support the spring above the resilient sheet.

30. The keyboard switch of claim 26, wherein said spring means is a coiled spring having a conically-shaped bottom portion and a cylindrically-shaped top portion.

* * * * *